United States Patent [19]

Herzner

[11] 4,297,567
[45] Oct. 27, 1981

[54] APPARATUS FOR RECEIVING STORING AND OUTPUTTING DIGITAL SIGNAL SEQUENCES

[75] Inventor: Karl H. Herzner, Hamburg, Fed. Rep. of Germany

[73] Assignee: U.S. Philips Corporation, New York, N.Y.

[21] Appl. No.: 59,919

[22] Filed: Jul. 20, 1979

[30] Foreign Application Priority Data

Aug. 7, 1978 [DE] Fed. Rep. of Germany ....... 2834509

[51] Int. Cl.³ .................................. H03K 21/34
[52] U.S. Cl. .................. 235/92 PB; 235/92 SH; 235/92 CA; 235/92 EV; 365/73
[58] Field of Search ......... 235/92 SH, 92 CT, 92 PB, 235/92 CA, 92 EV, 92 DP; 365/73, 75; 328/37; 307/221 R

[56] References Cited

U.S. PATENT DOCUMENTS

| | | | |
|---|---|---|---|
| 3,579,203 | 5/1971 | Malmer | 365/73 |
| 3,691,536 | 9/1972 | Peterson | 235/92 SH |
| 3,941,982 | 3/1976 | Knollenberg et al. | 235/92 SH |
| 3,972,031 | 7/1976 | Riemenschneider et al. | 365/73 |
| 3,984,662 | 10/1976 | Sorenson | 235/92 SH |

Primary Examiner—Joseph M. Thesz
Attorney, Agent, or Firm—Thomas A. Briody; Robert T. Mayer; James J. Cannon, Jr.

[57] ABSTRACT

An apparatus for receiving, storing and outputting digital signal sequences wherein both the length of the sequences and the individual digital signals themselves may be adjusted without extensive hardware requirements, the apparatus having a content addressable capability. The apparatus includes a serial first-in first-out memory a control circuit including a digital clock and a plurality of control signals for erasing, modifying, and addressing the digital signals.

6 Claims, 3 Drawing Figures

APPARATUS FOR RECEIVING STORING AND OUTPUTTING DIGITAL SIGNAL SEQUENCES

BACKGROUND OF THE INVENTION

The invention relates to apparatus for receiving, storing and outputting digital signal sequences. Each digital signal may represent a test pattern and sequences thereof may, for example, be used for testing digital electronic devices of various kinds. One such apparatus has been disclosed in the German Patent No. 1220474. Therein the storing and outputting is effected by means of shift registers. For adjusting the digital signals, the output of each such shift register is provided with a switching arrangement. For adjusting the length of the sequence further switching arrangements are provided. This allows for freely modifiable digital signal sequences to be generated; however, a large number of switches are necessary which leads to appreciable space requirements, and also to a complicated set-up.

SUMMARY OF THE INVENTION

It is an object of the invention to provide an apparatus for recieving, storing, and outputting digital signal sequences, wherein both the length of the sequences and the individual digital signals themselves may be adjusted in a straight forward manner without extensive hard ware requirements being necessary. It is a further object of the invention to provide such an apparatus having a "content addressable" facility. The object of the invention is realized by an apparatus for receiving, storing, and outputting digital signal sequences, said apparatus comprising a serial first-in-first-out storage means, having a digital signal input and an input clock terminal for storing a digital signal received under control of an input clock signal, a digital signal output and an output clock terminal for outputting and erasing a digital signal stored under control of an output clock signal retrocoupling means having a first position for interconnecting said digital signal output to said digital signal input and a second position for receiving a digital signal from an external terminal, a control means having a primary clock input, a primary clock output coupled to said input clock and output clock terminals, first and second inhibit lines for selectively inhibiting said input clock terminal and output clock terminal, respectively, a further control output for controlling the position of said retrocoupling means, a first data input connected to said digital signal output and a second data input for receiving a further digital signal to be compared to the signal on said first data inputs in a first comparing means linked thereto; said control means having furthermore a control signal input for receiving mode control signals, said mode control signals comprising: a first signal for controlling a storing mode by driving said retrocoupling means to said second position while furthermore driving said input clock terminal but inhibiting said output clock terminal; a second signal for controlling an erasing mode by driving said output clock terminal but inhibiting presentation of a digital signal at said digital signal input; a third signal for controlling a modifying mode regarding an individual digital signal as stored in said storage means by driving said retrocoupling means to said second position while furthermore cooperatively driving said input clock terminal and said output clock terminal; a fourth signal for controlling an outputting mode thereby outputting a sequence of digital signals as stored in said storage means by driving said retrocoupling means to said first position while furthermore cooperatively driving said input clock terminal and said output clock terminal; a fifth signal for controlling a first addressing mode thereby content-addressing said storage means by activating said first comparing means for generating, upon equality detected therein generating, a first equality signal for co-controlling a further one of said control signals.

First-in-first-out storage devices have been commercially known for some time, such as the parts Am 2812 and TMS 4024. A very advantageous feature of this kind of devices is that the sequence of signals stored is presented at the output, whereby no interruption without any data presentation will occur. The length of a sequence is, within the capacity of the storage device, determined only by the amount of data stored. The data content may be modified quite easily in several ways, by adding new signals, by erasing certain signals, or by interchanging signals present by new signals.

For modifying a predetermined digital signal in the sequence several addressing modes may be advantageous therebefore, a first addressing mode has been described, wherein the addressing is performed solely on the basis of the information content of the digital signal proper. Such addressed digital signal may be modified or erased, or alternatively may be supplemented by an additional digital signal sequence to be stored directly contiguously to the digital signal addressed.

It should be noted that the inhibiting of presenting a digital signal to the storage means may be effected in several ways. One way is to inhibit the input clock signals. A different way may be to feed the input of the storage means with dummy signals which are not recognized as operative digital signals within the storage means.

In certain instances a digital signal sequence may contain a plurality of identical digital signals. In that case content-addressing the second or further digital signal thereof will require additional measures. Therefore, advantageously said mode control signals comprise a sixth signal for controlling a second addressing mode thereby content-addressing said storage means by activating said first comparing means for generating, upon equality detected therein, a first equality signal for starting a delay counter, said apparatus furthermore having a second comparing means for comparing the position of said delay counter to a further digital signal received on a further input of said second comparing means for generating, upon equality detected therein, a second equality signal for co-controlling a further one of said control signals. Again the resulting address may be the basis of a storing, an erasing or a modifying operation.

FURTHER DETAILS OF THE INVENTION

On the other hand, the apparatus advantageously comprises furthermore third comparing means and an address counterconnected for counting the clock pulses on said output clock terminal, wherein said mode control signals furthermore comprise a seventh signal for controlling a third addressing mode thereby directly addressing said storage means by activating said third comparing means for comparing the position of said address counter to a further digital signal received on a further input of said third comparing means for generating, upon equality detected therein, a third equality signal for controlling a further one of said control signals. This allows for direct addressing of a predetermined digital signal, without reference to its own content or the contents of other digital signals.

Advantageously, the apparatus comprises furthermore a forward-backward counter for as cycle-length counter differentially counting said input clock signals and output clock signals, and a fourth comparing means for comparing the position of said forward-backward counter and the position of said address counter, for generating, upon equality detected therein, a fourth equality signal for resetting said address counter to its initial position. In this way, the position of the cycle length counter always indicates the length of the stored sequence of digital signals, while the position of the address counter is correct, regardless whether a number of sequencing cycles has been executed.

Also, advantageously, an output of each said comparing means is connected to a logical OR-gate for generating, upon reception in said OR-gate of an equality detected, a termination signal for thereupon inhibiting said primary clock output. This allows for either easy modification, insertion or erasion of a specifically addressed digital signal, or, alternatively, for producing at the output of the storage means the complete sequence of digital signals only a single time.

Advantageously, for at least one of said comparing means there is provided a gating means having a first input connected to the "equality" output of the corresponding comparing means, and a second input connected to a transmission controlling means, said transmission controlling means having a clock input, a mode control input for being synchronously set to a first position for rendering said gating means transmissive, a reset input connected to an output of said gating means for being synchronously reset to a second position for blocking said gating means, an inverse value of a signal controlling said gating means being transiently operative as a mode control signal for addressing a single position in the sequence of digital signals stored in said storage means. In this way the manual control may be speeded up as fewer steps are necessary for generating the correct sequence of digital signals.

BRIEF DESCRIPTION OF THE DRAWINGS

The invention will be described with respect to the accompanying figures.

DETAILED DISCLOSURE OF THE PREFERRED EMBODIMENTS

Figure 1:
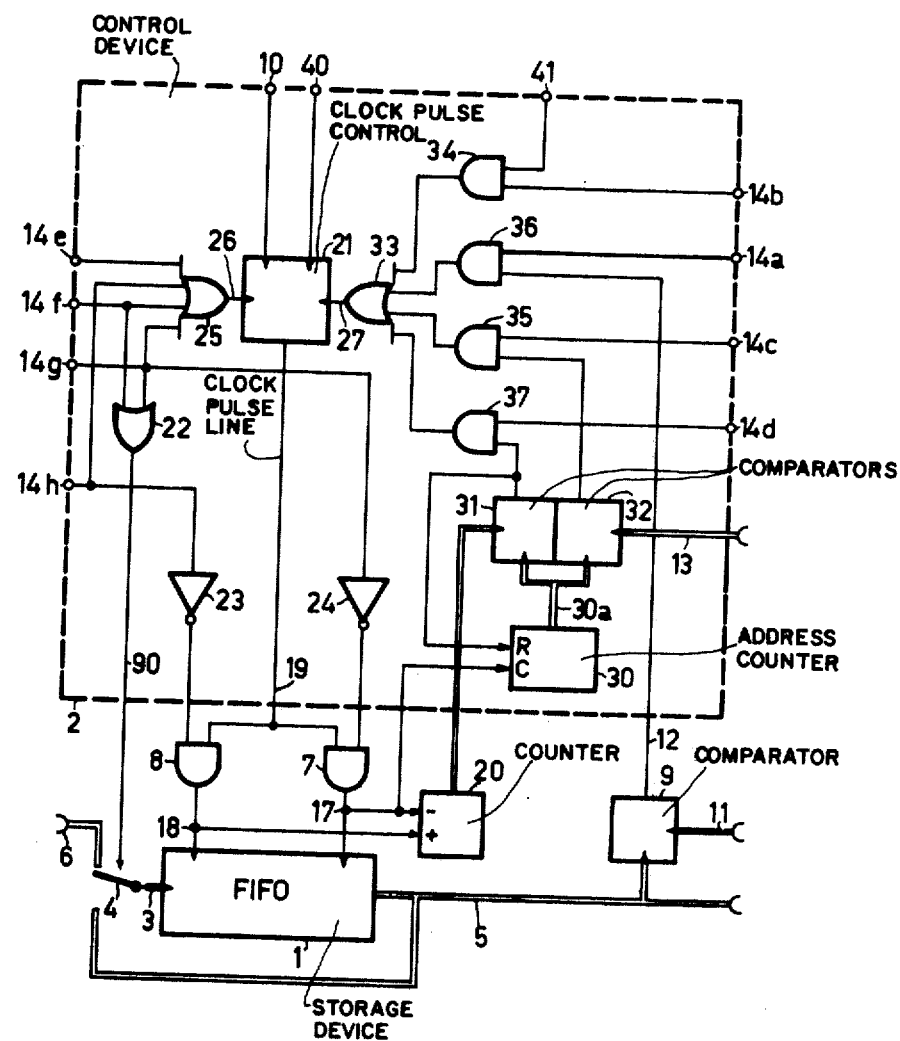
FIG. 1 shows a block diagram of an apparatus for receiving, storing and outputting digital signal sequences.

FIG. 1 shows a block diagram of an apparatus for receiving, storing and outputting digital signal sequences. Therein, element 1 is a first-in-first-out storage device, for example built from a device of the type Am 2812 or TMS 4024 or from a plurality of these devices connected in series and/or in parallel. Item 3 represents the data input terminal thereof, for receiving the digital signals to be stored. Item 5 is the corresponding data output terminal. The data path width of terminals 3,5 corresponds to the number parallel bits present in the data patterns (signals) stored. These digital signals may consist of one bit each, or, alternatively, may each comprise a plurality of bits, for example, sixteen. Generally corrections which may transport a plurality of bits in parallel have been indicated with double lines. Furthermore, store 1 has an input clock terminal 18 and an output clock terminal 17.

A FIFO store as defined herein is a store which, under control of an input clock pulse at terminal 18, stores an input digital signal present at input 3 automatically at an empty storage position closest to the output. Alternatively such storage is controlled by an internal transport to said empty storage position. In this way the first digital signal appearing at input 5 is always the one which has been stored longest, and under control of an output clock pulse at terminal 17 the latter signal is followed by the next digital signal in line. The signal input is connected to a switching means 4 having an upper position (as indicated) and a lower position, and which is executed as a conventional multiplexing device, comprising electronic switches.

A first input of switching means 4 is connected to input 6 for admitting digital signals to be stored in store 1. Input 6 may be provided with as many separate leads as corresponds to the data path width of input 3. Alternatively, manually, operable switches may be provided for having an operator selectively providing a digital signal consisting of one or more bits. The other input of switching means 4 is retrocoupled to output 5.

The position of switching means 4 is controlled by a control signal on line 90 from control device 2 which has been drawn in an interrupted line. Control device 2 furthermore provides on line 19 a clock pulse or a clock pulse series for AND-gates 7, 8 which may be blocked (inhibited) by corresponding control signals produced by inverting buffers 23, 24.

A prominent operating mode of the apparatus is the continual cyclical presentation of the digital signals stored on output 5, for example for repeatedly testing a digital data device not shown, connected thereto. In that case switching means 4 is in its lower position for retrocoupling output 5 to input 3. Furthermore, under control of signals from buffers 23, 24, both gates 7, 8 are transmissive for gating clock pulses received on primary clock pulse output line 19 to clock pulse terminals 17, 18.

For inserting a digital signal into store 1, a control signal on line 90 drives switching means 4 in its upper position as shown. Furthermore, gate 7 remains blocked by a blocking signal from element 24, while gate 8 is transmissive by a corresponding control signal from element 23. Therefore, a clock pulse on line 19 will control the writing into the storage means of the digital signal present at input 6, thereby lengthening the digital signal sequence by one.

For erasing a digital signal which is present in store 1, and which has reached the storage position, therein which is closest to its output, a control signal from buffer 23 will inhibit a clock pulse signal on line 19, while buffer 24 at the same time is operative for rendering AND-gate 7 transmissive. Therefore, the digital signal is outputted at terminal 5, by the retrocoupling is deactivated. Thereby the sequence of digital signals stored is shortened by one. In this context the position of switching element 4 is irrelevant.

For modifying a digital signal which is present in store 1, and which has reached the storage position therein which is closest to its output, a control signal at line 90 will drive switching element 4 to its upper position as indicated, while further control signals from buffer elements 23, 24 will render gates 7,8 transmissive for a clock pulse on line 19. Therefore, such clock pulse will control the erasure of the digital signal appearing at output 5, wherein the remaining signals are supplemented by the digital signal present at input 6. Thereby the length of the sequence of digital signals stored in store 1 remains unchanged. If this each modifications of a digital signal stored is feasible. Modification of a sequence may thus be effected in a sequence of steps. In each step the digital signal presented at output 5 is either retrocoupled to the input 3 by having switching element 4 in its lower position, or alternatively, replaced by a new digital signal by having switching element 4 in its upper position.

The clock pulses on line 19 are derived from clock pulses on primary clock pulse input 10 which is connectable to a primary clock pulse source which continually produces clock pulses, but which has not been shown for brevity.

Several control modes will be described hereinafter, wherefor several control terminals 14a-14h have been shown in FIG. 1. A central element of control device 2 is the clock pulse control element 21, which may be of the type SN 74120. This monolythic pulse synchronizer is designed to synchronize asynchronous or manual signals with a system clock connected to line 10. The device will generate either a single pulse or a train of pulses synchronized with control functions. As used herein, only half of the commercially available device is effectively used. Each half has a clock input terminal, a mode control input, a first set input, a second set input, a reset input, a first output, and a second output. A start signal transition on line 40 (from high to low), connected to a set input of device 21 will cause the clock pulses received on terminal 10 (clock input of device 21) to be transmitted to line 19 which is connected to an output of device 21. In certain situations, it will be necessary to provide start signal input 40 with known means to avoid the adverse effects of mechanical jitter (e.g. in a push-button switch), which when uncontrolled, may operate as a series of signals received. Furthermore, line 26, which is connected to the mode input of device 21, must carry a logical zero (high voltage level). The transmission of a series of clock pulses will be terminated upon a reception of a signal transition (from high to low) on line 27 which is connected to the reset input of device 21. If line 26 carries a logical "1", a start signal on terminal 40 will produce transmission of only a single clock pulse in device 21. As described here, one output terminal and one set terminal of the operative half of device 21 remain unused. For further detail reference is had to Texas Instrument's TTL Data Handbook, 1973, pp. 264-268. Notably, a clock pulse source having an appropriate frequency will be used.

In the following, control terminals 14a-14h are supposed to carry a logical "zero" signal except for a single one thereamong, which may be selected, for example by means of a rotary 1 out of 8 switch which has not been shown for brevity, the position of said switch selecting the control mode. As will be described hereafter in some situations one or more modes may be controlled in a different way. This would obviously diminish the number of positions of the latter switch.

In a first control mode, a digital signal in store 1 is addressed with respect to its content. For effecting this, a comparator 9 has been provided, which, on the one hand, is connected to store output 5, and on the other hand to external terminal 11. The latter may be a data line, which is connected either to an external register storing the sought for contents, or an arrangement of manually operable switches which may generate a data value "one" or "zero". The data width of terminal 11 is equal to the width of terminal 5. In case store output 5 has only a serial pattern of single bit width, comparator 9 may execute a serial comparison. If an equality is detected, comparator 9 produces a "one" signal on line 12, which is conveyed to AND-gate 36. If control terminal 14a ("stop on pattern") carries a logical "1", the equal signal is gated via AND-gate 36 and OR-gate 33 to line 27, thereby causing device 21 to terminate the transmission of clock pulses to line 19.

Generally, operation of the apparatus is started by applying a starting pulse in terminal 40. The starting pulse will have a width comparable to the length of a clock pulse, because in certain cases transmission of only one clock pulse may already effect generation of a stop signal directly thereafter. If line 26 carries a logical zero, in principle a continuous train of clock pulses may result on line 19. Ther zero signal on output line 26 of OR-gate 25 implies that none of the terminals 14e, 14f, 14g, 14h, carries a logical "one". Thus, also, OR-gate 22 produces a logical "zero" which drives switching element 4 to its lower position, while furthermore, both inverting buffers 23, 24 make AND-gates 7,8 transmissive. Thus FIFO-store 1 is essentially retrocoupled, while the digital signals produced on terminal 5 are stored again via terminal 3. Also, terminal 5 may be connected to further elements, such as a digital data device under test.

For filling the store 1, or for inserting into a stored sequence of digital signals a "new" signals, control terminal 14g, which may be connected to a manually settable switch, is driven with a logical "1". Thus OR-gate 25 produces a logical "1" for controlling a single-step-operation. Also, OR-gate 22 produces a logical "1" for driving switching element 4 to its upper position. Finally, inverting buffer 24 blocks AND-gate 7. Therefore, each start-signal on terminal 40 will produce a single clock-pulse via AND-gate 8 to clock terminal 18 for writing the digital signal present at terminal 6 into store 1. Furthermore, this single clock pulse is forwarded to the up-counting input of up-down counter 20, which thereupon increments its position by 1. When a sequence of digital signals is first written into the store, which originally is completely empty, this counter starts at position zero. Thereby, the position of this counter indicates the number of digital signals (or patterns) stored in store 1. If required, an overflow output may be provided with counter 20 indicating that store 1 has been filled to capacity. In normal use, on the other side, AND-gates 7,8 will gate coinciding clock pulses, both of which are communicated to counter 20, those emanating from AND-gate 7 to the down-counting input ($-$). In that situation the position of counter 20 remains essentially constant. In certain situations additional measures may be necessary in order to avoid exact coincidence of clock pulses at the $+$ and $-$ inputs, for example by means of a relative delay which is short with respect to the clock pulse period, or by other known means.

For erasing a digital signal in store 1, a logical "1" is generated at terminal 14h. This produces a single-step-control signal "1" at line 26, while also inhibiting AND-gate 8, and making AND-gate 7 transmissive. In this situation OR-gate 22 produces a "zero". The position of switching device 4, however, is irrelevant to this control mode. The output clock pulse from AND-gate 7 decrements the position of up-down-counter 20 by one. In certain circumstances counter 20 will have means for signalling a zero position indicating that store 1 is completely empty. The relevance of counter 30 will be described as hereinafter.

For modifying a digital signal stored in store 1 terminal 14f is controlled by a logical 1 thereon. This produces a single-step-control signal "1" at line 26, while also driving switching device 4 to its upper position by means of a "1" on the output of OR-gate 22. Both AND-gates 7 and 8 are transmissive in this situation. Therefore, the digital signal appearing at output terminal 5 is replaced by the one, present at terminal 6. The length of the sequence of digital signals stored remains unchanged thereby.

For cycling the sequence of digital signals stored by single step, without any additional modification, a logical "1" is generated at terminal 14e. In this way a single-step-control-signal is produced at line 26. Furthermore, switching device 4 is driven to its lower position, while both AND-gates 7,8 are transmissive. All single-step-modes described hereabove are started by a starting signal as terminal 40, and may be repeated as many times as required.

The apparatus furthermore comprises an address counter 30 having counting input C and a reset input R. The counting input is connected to the output of the AND-gate 7. Thus the position of counter 30 will indicate the number of digital signals or patterns which have been presented on output terminal 5, starting from the beginning of the sequence stored in store 1. The position of counter 30 by means of connection 30a is communicated to comparators 31, 32. Connection 30a has an appropriate data path width accommodating the highest position of counter 30. In comparator 31 the positions of the address counter 30 and the up-down-counter 20 (indicating the length of the sequence of digital signals stored in store 1), are compared. Upon detection of equality a "1"-pulse is produced at the output of comparator 31, which is communicated to AND-gate 37, and furthermore, to the reset input R of counter 30. This implies that the position of address counter 30 at all times indicates a relative address with respect to an initial signal of the sequence of digital signals stored in store 1. In this respect, a logical "1" signal on control terminal 14d will transmit this reset signal via AND-gate 37 and OR-gate 33 to terminal 27 of device 21, whereby it will reset device 21 and thus terminate transmission of clock pulses to line 19. In this way it is possible to produce the total amount of signals stored in store 1 at output terminal 5 thereof only a single time. Alternatively, this control mode effects a reset of the sequence to its first signal, for example after a modification, erasure or insertion had been effected by means of one of more control modes effected by terminals 14e, 14f, 14g, 14h.

In comparator 32 the position of address counter 30 is compared to an externally provided address on line 13. An equality selected will produce a signal pulse to AND-gate 35. Thus, a direct addressing mode is feasible by means of a logical 1 signal on control terminal 14c: then equality will produce a reset signal in line 27 to terminate the transmission of clock pulses on line 19. In this case AND-gate 37 remains blocked, while, however, the resetting of address counter 30 is still effected. Equality may be detected in comparator 32 if the value of the address code on line 13 is lower than or equal to the position of up-down-counter 20. After the apparatus has halted at the address specified at terminal 13 several operations are possible. The digital signal on the specified address may be modified or erased, or, alternatively, a new digital signal may be supplemented. Alternatively, a transition to single stepping without change may be effected (terminal 14e).

A further control mode is a continuous cycling which is generated by driving terminal 14b by a logical "1". A start signal thereupon following on terminal 40 will produce an uninterrupted cycling of the contents of store 1, until a stop signal is received on terminal 41. This will produce an output signal from AND-gate 34 which via OR-gate 33 will reset device 21. There are thus four control modes which may produce a plurality of clock pulse cycles on line 19. These modes are produced by driving one of the terminals 14a, 14b, 14c, 14d. In these cases always both AND-gates 7,8 are transmissive, while furthermore, switching device 4 is in its lower position. In certain situations it may be advantageous that AND-gate 34 be omitted, whereby the signal on terminal 14b is not used. In that case the stop signal on terminal 41 may be operative in any other of the control modes described.

Figure 2:
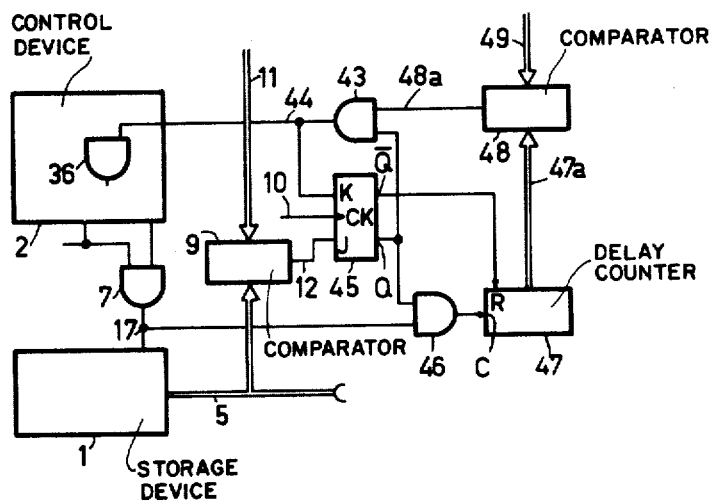
FIG. 2 shows the control of a delay counter.

In certain situations the store 1 may contain a series of directly successive identical digital signals or patterns. This results in the inoperability of the content-addressing mode described hereabove, because only the first of such a series may be addressed therewith. In this respect FIG. 2 shows the control of delay counter, whereby a digital signal may be addressed by means of its position relative to a digital signal which may be content-addressable. Items already present in FIG. 1 carry the same references. Now, the line 12 for transporting the "equality" signal from comparator 9 is not directly connected to AND-gate 36 in control device 2. Here, however, line 12 is connected to the J-input of JK-flipflop 45. The clock-pulse input of JK-flipflop 45 is connected to primary clock pulse input line 10. The K-input is connected to line 44, while the flipflop is triggered by the negative-going rear edges of the clock pulses on line 10. In case the flipflop is of the type which is triggered by the positive going edges the clock pulses must be communicated thereto via an inverter. Normally, AND-gate 43 will signal a logical "zero". The equality signal on line 12 will at the end of a clock pulse, which lets the equality-causing digital signal appear at terminal 5, set flipflop 45 to its "1" position, thereby rendering AND-gate 46 transmissive. In this way, further clock pulses on terminal 17 will arrive via AND-gate 46 to counting input C of delay counter 47, which thus each time is incremented by one. The position of counter 47 by means of data path 47a is communicated to comparator 48. Data path 47a has a width accommodating the highest position of counter 47. In comparator 48 the position of counter 47 is compared to an externally provided quantity on terminal 49. As described with respect to terminal 11, here a machine-generated code, or alternatively, a manually preset code is receivable. The data on terminal 49 indicates the off-set of the digital signal sought with the digital signal identified by means of comparator 9. This offset (or delay as measured in clock pulse periods) may have any value, including zero. Upon detection of equality in comparator 48, it will signal such equality by a logical "1" on line 48a, thereby producing a "1" signal on line 44 by coincidence with the "1" signal on the Q-output of flipflop 45. The signal on line 44 is communicated to AND-gate 36

(FIG. 1) in lieu of the signal on line 12 generated by comparator 9. The signal on line 44 will therefore terminate transmission of clock pulses on line 19.

Line 44 is connected furthermore to the K input of flipflop 45. A "1" on line 44, resulting from the equality selected in comparator 48 and the "1" position of flipflop 45 will, upon the reception of the rear edge of the clock pulse producing the "equality"-generating position of counter 47, reset flipflop 45 to its zero position. The signal on the $\overline{Q}$ output thereof will reset counter 47 to its zero position (R-input thereof).

If the data generated on terminal 49 is zero, the comparator 48 will directly signal equality, thereby unblocking gate 43. The equality signal on line 12 will set flipflop 45 to its "1" position as described hereinbefore (at the rear-edge of the clock-pulse), the "one" signal on line 44 enabling the resetting of flipflop 45 directly thereafter. Upon the appearance of the "1" signal on line 44, the digital signal to be operated upon will still be present at output terminal 5 of store 1, so that the operations thereon (for example erasing) may still be executed.

A different arrangement would be to have instead of counter 47 a presettable counter, the position thereof being externally provided by means of an external data correction such as line 29. The setting may be executed by the "start" signal on terminal 40. The output pulses of AND-gate 46 would then decrement the position of this counter. Comparator 48 would be superfluous, but counter 47 would have an output for signalling that position "zero" thereof is reached. The latter output signal would be connected to AND-gate 43 in lieu of line 48a.

Figure 3:
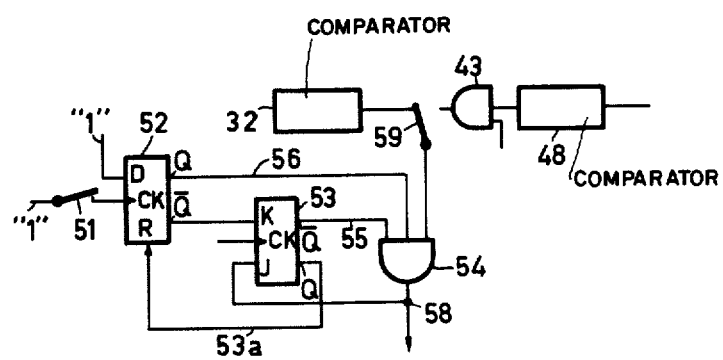
FIG. 3 shows a different control by means of the choice among the control modes.

As described hereinbefore, the modification of a digital sequence would be executed in three steps. First the digital signal stored would be addressed, either by its content, or directly by its address, or by its relative address as described with respect to FIG. 2. Next, a single-step operation would be executed, whereto the mode signal would have to be changed. Thereafter, the remainder of the cycle would be executed, for example, by driving terminal 14d with a logical "1". Here, FIG. 3 gives an arrangement for executing a modification of the sequence of digital signals without stopping. If required this arrangement would be provided separately for each of the three kinds of modification (inserting, modifying and erasing). Here, the execution for modifying a digital signal is described. The Figure shows comparator 48, AND-gate 43, comparator 32 and its output line for transmitting an "equality". These elements have been described hereinbefore with respect to FIGS. 1, 2. Furthermore, the arrangement comprises a positive-edge-triggered D-flipflop 52, a JK-flipflop 53, an AND-gate 54, and switches 51, 59. The data input of flipflop 52 is connected to a logic "1" signal as is the input connection to switch 51. When a modification of a digital signal is to be made, switch 51 is closed, for example by a manually provided signal not shown. This drives flipflop 52 to the "one"-position. If required, a known arrangement for countervailing jitter interferences may be connected to the output connections of flipflop 52 to ensure that the 0-1 transition on line 56 is treated only once. AND-gate 54 now receives a "1" on line 56, a "1" on line 55 (JK-flipflop 53 initially was in the "zero" position) and a signal from switch 59. Switch 59 may be put manually (before actuation of swtich 51) in one of its two positions, thereby enabling direct addressing (output signal of comparator 32) or content-addressing (output signal of comparator 48 and AND-gate 43) of the stored digital signal. Upon reaching the selected equality, switch 59 communicates a logical "1", whereby AND-gate 54 also produces a logical "1". The clock input CK of negative-edge triggered flipflop 53 is connected to primary clock-input terminal 10 in FIG. 1. Therefore, the rear edge of the clock pulse causing the equality will set JK flipflop 53 to its position "one", thereby terminating the one output signal "1" from AND gate 54, and also resetting D-flipflop 52 by means of line 53a. The rear edge of the next clock pulse will thus reset flipflop 53 to its "zero" position. Thus, output 58 will be at one during only a single clock pulse period. Furthermore, output 58 is connected to input 14f (single-step-modify in FIG. 1), instead of the signal on input 14f to be realized by the position of the one out of 8 switch described earlier. This input, however, must not now be connected to OR-gate 25, because this would drive control device 21 to its single step operating mode.

An arrangement as shown in FIG. 3 may likewise be present for erasing and inserting a digital signal in the sequence stored in store 1. This may lead to detection of the connection of all three connections from inputs 14f, 14g, 14h to OR-gate 25. If only input 14e remains, no OR-gate 25 would be necessary.

Alternatively, the control input to switch 51 would be present in addition to the corresponding input (14f, 14g, 14h). This would have OR-gate 22 with two more inputs (for inserting and modifying), and elements 23, 24 replaced by two-input NOR gates.

As further modification a further arrangement according to FIG. 3 would be provided for effecting a stopping operation. This arrangement would have its output 58 connected to the input of a manually settable selection switch with one input and two outputs. The two outputs of this switch would be connected to inputs 14a, 14b respectively, whereby the corresponding positions of the one-out-of-8 switch described hereinbefore would be absent. This would effect the operating modes stop an address, and a content-addressed stop operation. Yet a further possibility would be that the stop arrangement has a single output only, connected to input terminal 14c. The other input to AND-gate 35 would then be connected to a manually operated two-input, one output selection switch. These two inputs would conduct the equality signals of comparators 32 and 48, respectively, whereas in certain situations only terminals 14b, 14d, 14e would not be provided with an arrangement according to FIG. 3, there three position mode switch would suffice. When, furthermore, in FIG. 2 instead of counter 47 a down-counter is provided, the load-signal therefore may be generated by OR-ing the output signals of switches 51 in FIG. 3, while maintaining the counter measures against mechanical jitter.

What is claimed is:

1. Apparatus for receiving, storing and outputting digital signal sequences, said apparatus comprising:
a serial first-in-first-out storage means, having a digital signal input and an input clock terminal for storing a digital signal received under control of an input clock signal, a digital signal output and an output clock terminal for outputting and erasing a digital signal stored under control of an output clock signal, retrocoupling means having a first position for interconnecting said digital signal output to said digital signal input and a second position for receiving a digital signal from an external terminal;

a control means having a primary clock input, a primary clock output coupled to said input clock and output clock terminals, first and second inhibit lines for selectively inhibiting said input clock terminal and output clock terminal, respectively, a further control output for controlling the position of said retrocoupling means, a first data input connected to said digital signal output and a second data input for receiving a further digital signal to be compared to the signal on said first data input in a first comparing means linked thereto; said control means having furthermore a control signal input for receiving mode control signals, said mode control signals comprising: a first signal for controlling a storing mode by driving said retrocoupling means to said second position while furthermore driving said input clock terminal but inhibiting said output clock terminal;

a second signal for controlling an erasing mode by driving said output clock terminal but inhibiting presentation of a digital signal at said digital signal input;

a third signal for controlling a modifying mode regarding an individual digital signal as stored in said storage means by driving said retrocoupling means to said second position while furthermore cooperatively driving said input clock terminal and said output clock terminal; a fourth signal for controlling an outputting mode thereby outputting a sequence of digital signals as stored in said storage means by driving said retrocoupling means to said first position while furthermore cooperatively driving said input clock terminal and said output clock terminal;

a fifth signal for controlling a first addressing mode thereby content-addressing said storage means by activating said first comparing means for generating, upon equality detected therein, a first equality signal for co-controlling a further one of said control signals.

2. An apparatus as claimed in claim 1, wherein said mode control signals comprise a sixth signal for controlling a second addressing mode thereby content-addressing said storage means by activating said first comparing means for generating, equality detected therein a first equality signal for starting a delay counter, said apparatus furthermore having a second comparing means for comparing the position of said delay counter to a further digital signal received on a further input of said second comparing means for generating upon equality detected therein, a second equality signal for cocontrolling a further one of said control signals.

3. An apparatus as claimed in claim 1 or 2, wherein said apparatus furthermore has third comparing means and an address counter connected for counting the clock pulses on said output clock terminal, wherein said mode control signals furthermore comprise a seventh signal for controlling a third addressing mode thereby directly addressing said storage means by activating said third comparing means for comparing the position of said address counter to a further digital signal received on a further input of said third comparing means for generating upon equality detected therein, a third equality signal for controlling a further one of said control signals.

4. An apparatus as claimed in claim 3, wherein said apparatus comprises furthermore a forward-backward counter a cycle-length counter differentially counting said input clock signals and output clock signals, and a fourth comparing means for comparing the position of said forward-backward counter and the position of said address counter, for generating upon equality detected therein, a fourth equality signal for resetting said address counter to its initial position.

5. An apparatus as claimed in claims 1 or 2, wherein an output of each of said comparing means is connected to a logical OR-gate for upon reception in said OR-gate of a detected equality, generating a termination signal for thereupon inhibiting said primary clock output.

6. An apparatus as claimed in claim 1 or 2, wherein for at least one of said comparing means there is provided a gating means having a first input connected to the "equality" output of the corresponding comparing means, and a second input connected to a transmission controlling means, said transmission controlling means having a clock input, a mode control input for being synchronously set to a first position for rendering said gating means transmissive, a reset input connected to an output of said gating means for being synchronously reset to a second pposition for blocking said gating means, an inverse value of a signal controlling said gating being transiently operative of a mode control signal for addressing a single position in the sequence of digital signals stored in said storage means.

* * * * *